United States Patent [19]

Graetzel et al.

[11] Patent Number: 5,350,644
[45] Date of Patent: Sep. 27, 1994

[54] PHOTOVOLTAIC CELLS

[75] Inventors: Michael Graetzel, St. Sulpice; Mohammad K. Nazeeruddin, Tavannes; Brian O'Regan, Vevey, all of Switzerland

[73] Assignee: Ecole Polytechnique, Federale de Lausanne, Lausanne, Switzerland

[21] Appl. No.: 941,073

[22] PCT Filed: Apr. 17, 1991

[86] PCT No.: PCT/EP91/00734
§ 371 Date: Oct. 15, 1992
§ 102(e) Date: Oct. 15, 1992

[87] PCT Pub. No.: WO91/16719
PCT Pub. Date: Oct. 31, 1991

[30] Foreign Application Priority Data

Apr. 17, 1990 [GB] United Kingdom ............. 9008512.7
Nov. 15, 1990 [GB] United Kingdom ............. 9024831.1

[51] Int. Cl.$^5$ ............................................. H01M 6/36
[52] U.S. Cl. .................................................. 429/111
[58] Field of Search ....................................... 429/111

[56] References Cited

U.S. PATENT DOCUMENTS 4,117,210 9/1978 Deb ....................... 429/111
4,927,721 5/1990 Grätzel et al. ............ 429/111

FOREIGN PATENT DOCUMENTS 0333641 9/1989 European Pat. Off. .
WO85/05119 11/1985 PCT Int'l Appl. .

OTHER PUBLICATIONS

H. O. Finklea, *A.C.S. Advances In Chemistry*, No. 184, pp. 253–268 (1980).
V. H. Houlding et al., *J. Am. Chem. Soc.*, vol. 105, pp. 5695–5696 (1983).
W. D. Clark et al., *J. Am. Chem. Soc.*, vol. 99, pp. 4676–4682 (Jul. 1977).
Patent Abstracts of Japan, vol. 7, No. 48 (P-178) [1193], for "Photosensitive and Thermosensitive Recording Member", Ricoh K. K.
"Extension of the Optical Absorption Range of $TiO_2$ Thin Films by Chromium and Cadmium Doping", F. A. Soliman, H. J. J. Seguin, Thin Solid Films, 145 (1986) pp. 61–67, Dec., No. 1.

*Primary Examiner*—Aaron Weisstuch
*Attorney, Agent, or Firm*—Woodard, Emhardt, Naughton Moriarty & McNett

[57] ABSTRACT

A photovoltaic cell comprising a light transmitting electrically conductive layer deposited on a glass plate or a transparent polymer sheet to which a series of titanium dioxide layers have been applied, in which at leash the last titanium dioxide layer (optionally also the second to last and third to last layer) are doped with a metal ion which is selected from a divalent or trivalent metal.

8 Claims, 1 Drawing Sheet

Fig. 1

PHOTOVOLTAIC CELLS

The invention relates to new transition metal dyestuffs and to their use in photovoltaic cells. These dyes can be coated on titanium dioxide films rendering such devices effective in the conversion of visible light to electric energy.

BACKGROUND OF THE INVENTION

Titanium dioxide films (layers) are known for their semiconductive properties and this property renders them useful for photovoltaic cells. However, titanium dioxide has a large band gap and therefore it does not absorb light in the visible region of the spectrum. For solar applications it is important that the titanium dioxide film be coated with a photosensitiser which harvests light in the wavelength domain where the sun emits light, i.e. between 300 and 2000 nm. Thermodynamic considerations show that conversion of solar energy into electricity is achieved in the most efficient fashion when all the emitted photons with wavelengths below 820 nm are absorbed by the photosensitizer. The optimal dye for solar conversion should therefore have an absorption onset around 800 nm and the absorption spectrum should be such that it covers the whole visible domain.

A second requirement for efficient solar light energy conversion is that the dyestuff after having absorbed light and thereby acquired an energy-rich state is able to inject with practically unit quantum yield, an electron into the conduction band of the titanium dioxide film. This requires that the dyestuff be attached to the surface of the titanium dioxide through suitable interlocking groups. The function of the interlocking group is to provide electronic coupling between the chromophoric group of the dyestuff and the conduction band of the semiconductor. This type of electronic coupling is required to facilitate electron transfer between the excited state of the dyestuff and the conduction band. Suitable interlocking groups are $\pi$-conducting substituents such as carboxylate groups, cyano groups, phosphate groups or chelating groups with $\pi$-conducting character such as oximes, dioximes, hydroxy quinolines, salicylates and alpha keto enolates. The electrons, photoinjected by the dyestuff, generate electrical current in the external circuit when the photovoltaic cell is operated.

SUMMARY OF THE INVENTION

According to the invention there is provided a photovoltaic cell comprising:

a light transmitting electrically conductive layer deposited on a glass plate or a transparent polymer sheet to which one or more preferably porous high suface area titanium dioxide layers have been applied, in which at least the last titanium dioxide layer (optionally also the second to last and the third to last layer) may be (preferably are) doped with a metal ion which is selected from a divalent or trivalent metal.

Still further according to the invention there is provided a photovoltaic cell comprising:

i) two electrodes, at least one of which is transparent and has a visible light transmittance of at least 60%, the plates being arranged so as to define a receptacle between them, in which receptacle an electrolyte is located, said one transparent electrode having, in addition, an electrolyte-contacting film of titanium dioxide; and ii) means for permitting the passage of an electrical current generated by the cell;

wherein the improvement comprises the electrolyte-contacting surface of said film being doped with at least one ion selected from divalent and trivalent metals and boron.

For the purposes of this invention it is essential that the dopant be confined to the surface of the titanium dioxide, that is, to the titanium dioxide/electrolyte interface or very close thereto. The preferred way of achieving this is by the application of a series of layers of titanium dioxide casting, one on top of the other, with up to the last three layers containg the dopant. Preferably the last four layers and most preferably the last layer contain the dopant.

Preferably a photosensitiser dye is applied to the doped $TiO_2$ layer. Preferably such a photosensitiser is a ruthenium, osmium or iron complex or a combination of two or three transition metals in one supramolecular complex.

Preferably, a photovoltaic cell according to the invention comprises an electrically conductive first plate to which a film preferably having a thickness of 0.1–50 microns of titanium dioxide coated with a transition metal complex photosensitizer is deposited; and a conductive second plate with no $TiO_2$ coating separated from the first plate by a thin layer of electrolyte, whereby the visible and preferably also the solar light transmittance of at least one of the plates is at least 60%.

The second plate (also known as "the counterelectrode") may be coated with a thin layer (preferably up to 10 microns thickness) of an electrocatalyst. The role of the electrocatalyst is to facilitate the transfer of electrons from the counterelectrode to the electrolyte. A further possible modification of the counterelectrode is to make it reflective to the light that impinges thereon, having first passed through the electrolyte and the first plate.

Preferably, a photosensitiser is applied to the surface of the titanium dioxide. More preferably, the photosensitiser is selected from a ruthenium, osmium, or iron transition metal complex or combinations thereof or a combination of two or three transition metals.

Preferably, the electrolyte contains a redox system (charge transfer relay). Preferably, such systems include iodine/iodide solutions, bromine/bromide solutions, hydroquinone solutions, or solutions of transition metal complexes transferring a nonbonding electron. The charge transfer relays present in the electrolyte transport electric charge from one electrode to the other. They act as pure mediators and undergo no chemical alteration during the operation of the cell. It is preferable that the electrolytes in a photovoltaic cell according to the invention are dissolved in an organic medium so that the dyes applied to the titanium dioxide surface are insoluble therein. This has the advantage that the cell has a long-term stability.

Preferred organic solvents for the electrolyte include but are not limited to alcohols and mixtures thereof, non-volatile solvents such as propylene carbonate, ethylene carbonate, and methyl pyrrolidinone, mixtures of non-volatile solvents with viscosity reducing solvents such as acetonitrile, ethylacetate, and tetrahydrofuran. Additional solvents are dimethylsulfoxide and dichloroethane. Where miscible, mixtures of any of the above may be used.

Preferably the titanium dioxide films have a roughness factor greater than one, the roughness factor being defined as the ratio of true to apparent surface area. More preferably, the roughness factor is 10–1000, most preferably 50–200. Preferably, the titanium dioxide layers are built up on the surface of the conductive layer using one of two methods. One, the "sol-gel method" is described in Stalder and Augustynski, *J. Electrochem. Soc.* vol. 126 p. 2007 (1979) and in Example 35. The other, the "colloidal method" is described in Examples 35 and 37.

The glass or polymer plate which is used for the transparent plate of the cell according to the invention is any transparent glass or polymer onto which a light transmitting electrically conductive layer has been deposited, such that the plate preferably has a visible light transmittance of 60–99%, more preferably 85–95%. Preferably, the transparent conductive layer has a surface resistance of less than 10 ohms per square cms, preferably from 1 to 10 ohms per square cm. Preferably, the transparent conductive layer used in a photovoltaic cell according to the invention is made of tin dioxide doped with ca. 0.8 atom percent of fluorine and this layer is deposited on a transparent substrate made of low-cost soda lime float glass. This type of conducting glass can be obtained from Asahi Glass Company, Ltd. Tokyo, Japan. under the brand name of TCO glass. The transparent conductive layer can also be made of indium oxide doped with up to 5% tin oxide, deposited on a glass substrate. This is available from Balzers under the brand name of ITO glass.

A photovoltaic cell according to the invention has the following advantages when compared to existing cells.

1. It has a higher open circuit voltage than conventional cells, while maintaining a fill factor comparable to that of conventional solar cells. The fill factor is defined as the electrical power output at the optimal cell voltage for light energy conversion divided by the product of open circuit voltage and short circuit current. A high open circuit voltage is very important for practical applications since it allows one to operate the cell at lower Ohmic losses than conventional photovoltaic cells which have a smaller open circuit voltage.

2. In contrast to p-n junction solid state solar cells where the semiconductor assumes the function of light absorption and carrier transport simultaneously, a photovoltaic cell according to the invention achieves the separation of these functions. Light is absorbed by the very thin layer of dyestuff adsorbed onto the surface of the titanium dioxide film while the charge carrier transport is carried out by the titanium dioxide film. As a consequence, a photovoltaic cell according to the present invention operates as a majority carrier device. This has the advantage that imperfections such as grain boundaries or other types of crystalline disorders or impurities and disorder within the $TiO_2$ film do not decrease the efficiency of the cell as would be the case if minority carriers were involved in the cell operation. Conventional solar cells operate with minority charge carriers and this explains the need to fabricate these cells from highly pure and ordered materials which are costly. The present invention permits the development of cheap solar cells. All the materials employed in the present cells are inexpensive, apart from the sensitiser. However, the latter is used in such small quantities, typically 0.3 millimoles per square meter, that its cost can be neglected with respect to that of the other components, e.g. the glass plates.

3. A further consequence of the fact that the present cell operates as a majority carrier device is that the cell voltage depends to a smaller degree on the intensity of the impinging light than that of a conventional solar cell. Thus, the present cell maintains its high efficiency under diffuse light or in cloudy weather, while the efficiency of a conventional cell decreases sharply under these conditions.

4. By selecting appropriate dyestuffs, the cell can be optimised with respect to solar energy conversion. A photovoltaic cell according to the present invention has an optimal threshold wavelength for light absorption at 820 nm corresponding to an energy of 1.5 eV. Such a cell can attain higher solar conversion efficiencies than a cell based on silicon.

5. A photovoltaic cell according to the present invention is able to convert diffuse light more efficiently to electricity than systems previously known.

6. A further advantage of a preferred photovoltaic cell according to the present invention is that it can be irradiated from the front side, back side, or both sides. It can be irradiated by passing the light through the counter-electrode and the electrolyte to the dyestuff absorbed at the $TiO_2$ layer or through the $TiO_2$ layer to the absorbed dyestuff. If both the dye coated electrode and the counterelectrode are transparent, then light from all directions can be collected. In this way it is possible, in addition to direct sunlight, to harvest diffuse reflected light. This will improve the overall efficiency of the solar cell. 7. A further advantage of a photovoltaic cell according to the present invention is that the specific texture and electronic properties of the dye loaded $TiO_2$ layer allow the counterelectrode to be placed directly on top of the working electrode. In other words, there is no need to employ a spacer such as a polymer membrane to keep the two electrodes apart in order to avoid the formation of a short circuit. The dielectric features of the dye coated $TiO_2$ layer are such that even though it may be in direct contact with the counterelectrode there is no break-through current due to short circuiting of the two electrodes. This is an important advantage for practical application of the cell since it simplifies the construction of the device and reduces its cost.

In the sol gel method, it is preferable that only the last three, the last two, or just the very top layer of the titanium dioxide is doped with a divalent or trivalent metal in an amount of not more than 15% doping by weight. However, the deposition of the pure dopant in form of a very thin top oxide layer can also be advantageous. In the latter case, a blocking layer is formed which impedes leakage current at the semiconductor-electrolyte junction. All of the $TiO_2$ layers are formed by the sol gel process method described in Example 34. Preferably the number of $TiO_2$ layers deposited is 10–11. Preferably the total thickness of the $TiO_2$ film is from 5 to 50 microns (more preferably 10–20 microns).

The photosensitising layer may be produced by applying to the $TiO_2$ layer a dye-according to the invention defined below.

Accordingly, a new series of dyes has been developed to act as efficient photo-sensitizers.

Further according to the invention, there is provided a photosensitizing dye comprising a transition metal (preferably ruthenium, osmium, or iron) complex, the ligands being bidentate or tridentate or polydentate polypyridyl compounds, which may be unsubstituted or substituted. Preferably one or more of these pyridyl compounds contains at least one cyano group.

Still further according to the invention, there is provided a photosensitizing dye, comprising a transition metal (preferably ruthenium, osmium, or iron) complex, at least one ligand comprising a mononuclear, cyano-containing pyridyl compound.

Preferably, there are three ruthenium atoms and six donating atoms per complex in a photosensitising dye according to the invention.

According to the invention, there is provided compounds of the formulas 1 to 10:

$$[M(L^a)(L^b) (\mu\text{-(NC)}M(CN)(L^c)(L^d))_2] \quad (1)$$

$$[M(L^a)(L^b) (\mu\text{-(NC)}M(L^c)(L^d)\mu\text{-(CN)}M(CN)(L^c)(L^d))_2] \quad (2)$$

$$[M(L^a)(L^b) (\mu\text{-(NC)}M(L^c)(L^d)\mu\text{-(CN)})_2M(L^c)(L^d)] \quad (3)$$

$$[(L^a)(L^b)(X)M \ \mu\text{-(NC)}M(CN)(L^c)(L^d)] \quad (4)$$

$$[M(L^a)(L^b)(X)_2] \quad (5)$$

$$[M(L^a)(L^b)(L^c)] \quad (6)$$

$$[M(L^a)(L^b) (\mu\text{-(NC)}M(L^c)(L^g))_2] \quad (7)$$

$$[M(L^a)(L^b) (\mu\text{-(NC)}M(L^c)(L^d) \ \mu\text{-(CN)}M(L^c)(L^g))_2] \quad (8)$$

$$[M(L^a)(L^g) \ \mu\text{-(NC)}M(L^g)(L^b)] \quad (9)$$

$$[M(L^a)(L^g) (X)] \quad (10)$$

in which
each M is independently selected from ruthenium, osmium, or iron; $\mu$-(CN) or $\mu$-(NC) indicates that the cyano group bridges two metal atoms;
each $L^a$, $L^b$, $L^c$, and $L^d$ independently is selected from 2,2'-bipyridyl, unsubstituted or substituted by one or two COOH groups; 2,2' bipyridyl substituted by one or two groups selected from $C_{1-16}$ alkyl, $C_{1-16}$ alkoxy and diphenyl; 2,2'-biquinoline unsubstituted or substituted by one or two carboxy groups; phenanthroline, unsubstituted or substituted by one or two carboxy groups and/or one or two hydroxy groups, and/or one or two oxime groups; 4,7 diphenyl-1, 10-phenanthroline disulfonic acid;diazatriphenylene, diazahydroxycarboxyl-triphenylene (for example 1,12 diazatriphenylene or 1,12 diaza (6-hydroxy-7-carboxy)triphenylene); carboxy pyridine - (for example 2-carboxypyridine );phenyl pyridine; 2,2'-Bis(diphenylphosphino) 1,1'- binaphthalene; (pyridyl azo) resorcinol (for example 4-(2-pyridyl(azo)resorcinol); bis (2-pyridyl) $C_{1-4}$ alkane; N,N,N',N'-tetra $C_{1-4}$ alkyl ethylene diamine;and di-$C_{1-4}$ alkyl glyoxime; 2,2'-biimidazole; 2,2'-bibenzimidazole; 2,-(2'-pyridyl)-N-methylbenzimidazole; 2,-(2'-pyridyl)benzothiozole; 2,-(2'-pyridylmethyl)benzimidazole;

$L^g$ is selected from terpyridyl, (unsubstituted or substituted by phenyl, which phenyl group is unsubstituted or substituted by COOH)(for example 2,2',6',2" terpyridine) and dicarboxy-pyridine (preferably 2,6-dicarboxy-pyridine); 2,6-bis(benzimidazole-2'-yl) pyridine; 2,6-bis(N-methylbenzimidazole-2'-yl)pyridine; 2,6-bis (benzothiazol-2'-yl)pyridine.

each X independently is halide, $H_2O$, $CN^-$, $NCS^-$, amine (primary or preferably secondary alkylamine) and/or pyridine.

Preferably, one of $L^a$ and $L^b$ has an interlocking group selected as defined above, preferably a —COOH, and/or an OH, and/or an =N—OH, and/or —CO—NH$_2$ group.

Preferably, the terpyridyl when substituted is substituted by $C_{1-4}$ alkyl (preferably methyl) and/or $C_{1-16}$ alkoxy (preferably methoxy) and/or carboxy on one or more of the pyridyl groups—for example 2,2',6',2" terpyridine.

Preferably, any phenanthroline in a $L^a$ to $L^d$ is selected from 5-carboxy-6-hydroxy-1,10-phenanthroline and 5,6-dioxime-10-phenanthroline.

Preferably, any diaza hydroxy carboxyl triphenylene in $L^a$ to $L^d$ is 1,12-diaza-6-hydroxy-7-carboxyl triphenylene.

Preferably, any $C_{1-16}$ alkyl -2,2' bipyridyl in $L^a$ to $L^d$ is 4- $C_{1-16}$ alkyl -2,2' bipyridyl.

Preferably, any carboxy pyridine in $L^a$ to $L^d$ is 2-carboxypyridine.

Preferably, any (pyridyl azo) resorcinol in $L^a$ to $L^d$, is 4-(2-pyridyl azo) resorcinol.

The new photosensitiser dyes according to the invention can be used in photovoltaic cells.

Compounds of formula 1

$$[M(L^a)(L^b)[\mu\text{-(NC)}M(CN)(L^c)(L^d)]_2] \quad (1)$$

can be prepared by reacting one mole of a compound of formula 1a $$M(L^a)(L^b) \ Cl_2 \ (1a) \quad (1a)$$

with 2 moles of a compound of formula 1b $$M(L^c)(L^d)(CN)_2 \quad (1b)$$

at an elevated temperature.

Compounds of formula 2 can be prepared by reacting one mole of a compound of formula 1 with a slight excess of two moles of a compound of formula 2a $$[M(L^c)(L^d)(CN)(H_2O)] \quad (2a)$$

at an elevated temperature.

Compounds of formula 3 can be prepared by reacting a compound of formula 1a defined above with 1 mole of a compound of formula 3a $$((NC)M(L^c)(L^d)(CN))_2M(L^c)(L^d) \quad (3a)$$

at an elevated temperature.

Compounds of formula 4 can be prepared by reacting one mole of a compound of formula 4a $$M(L^a)(L^b)(X)_2 \quad (4a)$$

with one mole of a compound of formula 4b $$M(L^c)(L^d)(CN)2 \quad (4b).$$

Compounds of formula 5 can be prepared by reacting one mole of a compound of formula 5a $$MX_3 \quad (5a)$$

with one mole of $L^a$ and one mole of ligand forming compound $L^b$ at an elevated temperature.

Compounds of formula 6 can be prepared by reacting one mole of a compound of formula 6a $$M(L^a)(L^b)Cl_2 \quad (6a)$$

with excess of one mole of a ligand forming compound $L^c$ at an elevated temperature.

Compounds of formula 7 can be prepared by reacting one mole of a compound of formula 7a $$M(L^a)(L^b)Cl_2 \quad (7a)$$

with 2 moles of a compound of formula 7b $$CN\ M\ (L^c)(L^g) \quad (7b)$$

at an elevated temperature.

Compounds of formula 8 can be prepared by reacting a compound of formula 8a $$M(L^a)(L^b)Cl_2 \quad (8a)$$

with two moles of a compound of formula 8b $$CN\ M(L^c)(L^d)CN\ M(L^c)(L^g) \quad (8b).$$

Compounds of formula 9 can be prepared by reacting a compound of formula 9a $$M(L^a)(L^g)(H_2O) \quad (9a)$$

with one mole of a compound of formula 9b $$M(L^b)(L^g)(CN) \quad (9b)$$

at an elevated temperature.

Compounds of formula 10 can be prepared by reacting one mole of a compound of formula 10c $$M(L^g)(X)_x\ Cl \quad (10c)$$

with one mole of ligand forming compound $L^a$ at an elevated temperature.

Further according to the invention there is provided an electrode comprising a transparent $TiO_2$ layer on a glass support, for use in photovoltaic cell systems.

Preferably, such a clear layer is produced by dispersion of collidal $TiO_2$ solutions on a glass support. Preferably, such solutions are prepared by hydrolysis of Ti-$(OCH(CH_3)_2)_4$.

By the term "transparent" is meant that 70%, more preferably 80%, of incident light passes through the glass.

DESCRIPTION OF THE PREFERRED EMBODIMENTS

The invention will now be illustrated by the following examples.

EXAMPLE 1

The ligands 2,2' bipyridine, 4,4'-COOH 2,2'-bipyridine, and $RuCl_3\ 3H_2O$ are commercial samples from Alfa and Fluka. All other materials are reagent grade and are used without further purification. Cis-dichloro bis (4,4'-COOH-2,2-bipyridine)Ru(II) is known.

a) Synthesis of cis-dicyano bis (2,2'-bipyridine)Ru(II) (relating to compounds of formula 5 above)

800 mg (1.45 mmol) of cis-dichloro bis (2,2'bipyridine) is dissolved in 80 ml of DMF, under $N_2$ in the dark. To this solution 190 mg (2.91 mmol) of KCN which is separately dissolved in $H_2O$ are added. The solution is heated at reflux for 3 hours. During the course of reaction, the dark purple solution changes to an orange red. The progress of this reaction is monitored with the help of UV/vis Spectrophotometer. The solution is filtered through a fine, glass frit and the filtrate is evaporated under reduced pressure, to dryness. The residue is dissolved in 20 ml of $H_2O$ and filtered, in order to remove any unreacted staring complex. Again the filtrate is evaporated to dryness. The resulted residue is dissolved in 15 ml of ethanol, and filtered through a fine glass frit, which removes quantitatively the product KCl. To the filtrate, 150 ml of diethylether is added. The turbid solution is placed in a refrigerator for 2 hours, after which time the precipitate is collected by filtration on to a glass frit. The precipitate is washed with 3×5 ml portions of 2:10 ethanol diethylether mixture, followed by anhydrous diethylether, and dried in vacuo; yield 0.62 gr, 90%. The purity of this complex can be checked by elemental analysis and luminescence behavior.

b) Synthesis of cis-dicyano bis (4,4'-COOH-2,2'-bipyridine) Ru(II) (relating to compounds of formula 5 above)

This complex is prepared as described by a method analogous to that previously described except for the isolation and purification steps. After refluxing the reactants cis-[Ru(4,4'-COOH-2,2'-bpy)$_2$Cl$_2$] and KCN in 1:2 ratio for 4 hours, the solution is allowed to cool and filtered through a fine glass frit. The filerate is evaporated to dryness, under reduced pressure. The resulting residue is dissolved in $H_2O$ at pH 6–7 and the required complex is isolated as a neutral salt at its isoelectric point, pH 2.6.

c) Synthesis of cyanobridged trimers of Ru (II); [RuL$_2$[(NC)$_2$RuL$_2$']$_2$] (relating to compounds of formula 1 above)

A complex as shown in Table 1 below can be prepared as follows. 307 mg (0.43 mmol) of RuL$_2$Cl$_2$ is dissolved in 30 ml of alkaline DMF, under $N_2$, in the dark. To this solution 400 mg (0.86 mmol) of RuL$_2$'(CN)$_2$ is added. The solution is heated at reflux for 6 hours and allowed to cool to room temperature. The solution is filtered through a fine glass frit and the filtrate is evaporated to dryness. The resulted residue is dissolved in $H_2O$ at pH 6–7. The pH of this solution is lowered to 3.2, which results in a dense precipitate. The solution is placed in a refrigerator for 10 hours, after which time the precipitate is collected by filtration onto a glass frit. The precipitate is washed with 2:5 acetone diethylether mixture followed by anhydrous diethylether and dried in vacuo; yield 450 mg (69%).

EXAMPLE 2 (relating to compounds of formula 1 above)

Example 1c is repeated using 0.86 mmol of Ru(II)L$_2$ (CN)$_2$ to produce a compound defined in Example 2 in Table 1.

EXAMPLE 3 TO 8

By a method according to Example 1 complexes as defined in Table 1 below can be prepared from appropriate reactants.

TABLE 1

| | Complex | L | L' |
|---|---|---|---|
| 1 | [Ru(L$_2$((CN)$_2$Ru(L')$_2$)$_2$] | 4,4'-(COOH)$_2$bpy | 2,2'-bpy |
| 2 | [Ru(L$_2$[(CN)$_2$Ru(L)$_2$]$_2$] | 4,4'-(COOH)$_2$bpy | |
| 3 | [Ru(L$_2$[(CN)$_2$Ru(L')$_2$]$_2$] | 4,4'-(COOH)$_2$bpy | 4,4'-(Me)$_2$-bpy$_2$ |
| 4 | [Ru(L$_2$[(CN)$_2$Ru(L')$_2$]$_2$] | 4,4'-(COOH)$_2$bpy | 4,4'-(ph)$_2$-bpy |
| 5 | [Ru(L$_2$[(CN)$_2$Os(L')$_2$]$_2$] | 4,4'-(COOH)$_2$bpy | 2,2'-bpy |
| 6 | RuL$_2$(CN)$_2$ | 4,4'(COOH)$_2$bpy | |
| 7 | RuL$_2$(CN)$_2$ | 2,2'-bpy | |
| 8 | RuL$_2$(CN)$_2$ | 4,4'-(Me)$_2$bpy | | in which
"bpy" = 2,2'-bipyridyl
"Me" = methyl
"ph" = phenyl

EXAMPLES 9-33

By a method analogous to that of Example 1, complexes as defined in Table 2 can be prepared from suitable reactants.

In Table 2, bpy=2,2' bipyridyl; biq=2,2' biquinoline and phen =1,10 phenanthroline.

in example 19 2-phenylpyridine is used.

in example 22 straight and branched alkyl groups are used.

in example 26 N,N-tetramethyl and C,C - tetramethyl ethylene diamine are used.

in example 27 2,2' bis(diphenylphosphino)-1,1'binaphthylene is used.

in examples 28,30 and 33 1,10 orthophenanthrolene is used and in example 31 4-(2-pyridyl) azo resorcinol is used.

TABLE 2

List of Ru-complexes with one or more 4,4'-dicarboxy-2,2'-bipyridine ligands

| # | Complex | L | L' |
|---|---|---|---|
| 9 | [RuL$_3$] | 4,4',5,5'-(COOH)$_4$-2,2'-bpy | — |
| 10 | [RuL$_3$] | 3,8-(COOH)$_2$-4,7-(OH)$_2$phen | — |
| 11 | [RuL$_3$] | 6,6'-(COOH)$_2$-2,2'-bpy | — |
| 12 | [RuL$_3$] [Ru$^{II}$,Ru$^{III}$] | 4,4'-(OMe)$_2$-2,2'-bpy | |
| 13 | [RuL$_2$(H$_2$O)$_2$] | 4,4'-(COOH)$_2$-2,2'-biq | — |
| 14 | [RuL$_2$Cl$_2$] | 4,4',5,5'-(COOH)$_4$-2,2'-bpy | — |
| 15 | [RuL$_2$(CN)$_2$] | 4,4'-(COOH)$_2$-2,2'-bpy | — |
| 16 | [RuL$_2$L'(H$_2$O)] | 4,4'-(COOH)$_2$-2,2'-bpy | 4-(COOH)pyridine |
| 17 | [RuL$_2$L'(H$_2$O)] | 4,4'-(COOH)$_2$-2,2'-bpy | 3,5-(COOH)$_2$pyridine |
| 18 | [RuL$_2$L'(H$_2$O)] | 4,4'-(COOH)$_2$-2,2'-bpy | pyridine |
| 19 | [RuL$_2$L'] | 4,4'-(COOH)$_2$-2,2'-bpy | phenylpyridine |
| 20 | [RuL$_2$L'] | 4,4'-(COOH)$_2$-2,2'-bpy | 4,4'-(COOH)$_2$-2,2'-biq |
| 21 | [RuL$_2$L'] | 4,4'-(COOH)$_2$-2,2'-bpy | 4,4'-(phenyl)$_2$-2,2'-bpy |
| 22 | [RuL$_2$L'] | 4,4'-(COOH)$_2$-2,2'-bpy | C$_{13}$H$_{27}$-2,2'-bpy |
| 23 | [RuL$_2$L'] | 4,4'-(COOH)$_2$-2,2'-bpy | 4,4'-(Me)$_2$-2,2'-bpy |
| 24 | [RuL$_2$L'] | 2,2'-bpy | 1,10-phenanlthroline-5,6-dioxime |
| 25 | [RuL$_2$L'] | 4,4'-(COOH)$_2$-2,2'-bpy | 1,2-bis(2-pyridyl)ethane |
| 26 | [RuL$_2$L'] | 4,4'-(COOH)$_2$-2,2'-bpy | (Me)$_4$-ethylenediamine |
| 27 | [RuL$_2$L'] | 4,4'-(COOH)$_2$-2,2'-bpy | binaphthyl |
| 28 | [RuL$_2$L'] | 4,4'-(COOH)$_2$-2,2'-bpy | 3,8-(COOH)$_2$-1,7-(OH)$_2$phen |
| 29 | [RuL$_2$L'] | 4,4'-(COOH)$_2$-2,2'-bpy | dimethylglyoxime |
| 30 | [RuL$_2$L'] | 4,4'-(COOH)$_2$-2,2'-bpy | 4,7-(OH)$_2$,1,10-phen |
| 31 | [RuL$_2$L'] | 4,4'-(COOH)$_2$-2,2'-bpy | 2-azopyridylresorcinol |
| 32 | [RuL$_2$L'] | 4,4'-(phenyl)$_2$-2,2'-bpy | 4,4'-(COOH)$_2$-2,2'-bpy |
| 33 | [RuL$_2$L'] | 4,4'-(phenyl)$_2$-2,2'-bpy | 4,7-(OH)$_2$,1,10-phen |

The complexes of Examples 1 to 33 are found to be useful as photosensitiser dyes and can be used as such in photovoltaic cells according to the invention.

EXAMPLE 34

Figure 1:
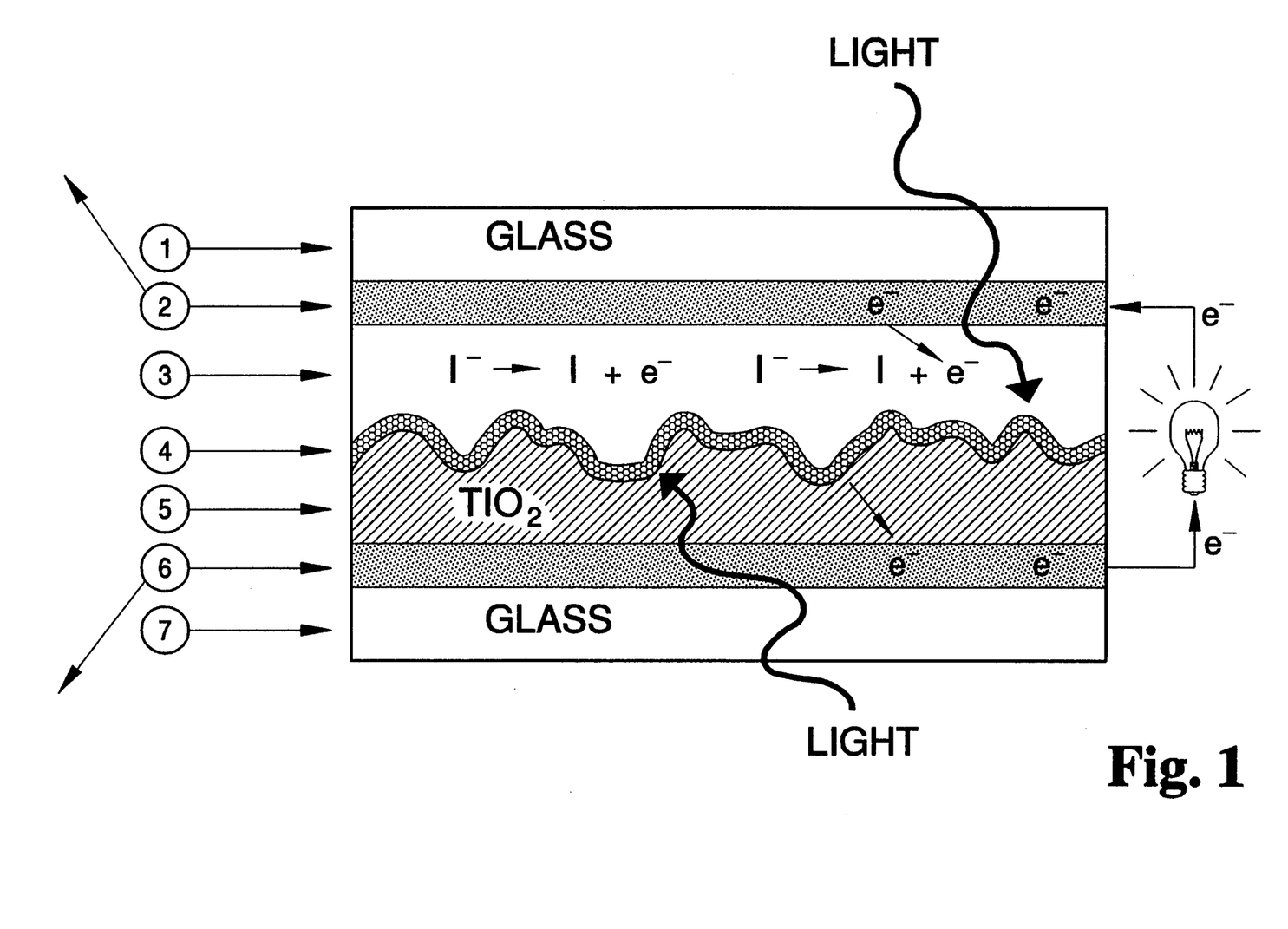
FIG. 1 is a cross-sectional elevational view of a preferred photovoltaic cell of the present invention.

A preferred photovoltaic cell is shown with reference to FIG. 1.

A photovoltaic device based on the sensitization of a aluminum-doped titanium dioxide film supported on conducting glass is fabricated as follows:

A stock solution of organic titanium dioxide precursor is prepared by dissolving 21 mmol of freshly distilled TiCl$_4$ in 10 mL of absolute ethanol. TiCl$_4$ in ethanol solution gives titanium alkoxide spontaneously, which on hydrolysis gives TiO$_2$ The stock solution is then diluted with further absolute ethanol to give two solutions (solution A and solution B having) titanium contents of 25 mg/ml (solution A) and 50 mg/ml (solution B). A third solution (C) is prepared from solution B by addition of AlCl$_3$ to yield an aluminum content of 1.25 mg/ml. A conducting glass sheet provided by Asahi Inc. Japan, surface area 10 cm$^2$ and having a visible light transmittance of at least 85% and a surface resistance smaller than 10 ohms per square cm is used as support for a deposited TiO$_2$ layer. Prior to use, the glass is cleaned with alcohol. A droplet of solution A is spread over the surface of the conducting glass to produce a thin coating. Subsequently, the layer is hydrolyzed at 28° C. for 30 minutes in a special chamber where the humidity is kept at 48% of the equilibrium saturation pressure of water. Thereafter, the electrode is heated in air in a tubular oven kept at 450° C., preheating it in the entrance of the oven for 5 minutes followed by 15 minutes of heating in the interior. Three more layers are produced in the same way. Subsequently, 5 thicker layers are deposited by using solution B. The same procedure as for the first layers is applied. Finally, solution C is used to deposit the last two layers containing the aluminum dopant. The heating of the last layer in the tubular oven is extended from 15 to 30 minutes. The total thickness of the titanium dioxide film is between 10 and 20 microns.

Prior to deposition of the dye, the film is subjected to a sintering treatment in highly purified 99.997% argon. A horizontal tubular oven composed of quartz tubes with suitable joints is employed. After insertion of the glass sheet with the TiO$_2$ film, the tube is twice evacuated and purged with argon. The glass sheet is then heated under argon flux at a flow rate of 2.5 L/h and a temperature gradient of 500° C./h up to 550° C. at which temperature it maintained for 35 minutes. This treatment produces anatase films with a surface roughness factor of 80–200.

After cooling under a continuous argon flow, the glass sheet is immediately transferred to an alcoholic solution of a chromophore. The chromophore employed is the trimeric ruthenium complex $$[Ru(L_2)[(CN)_2RuL_2']_2]$$

where L is 2,2'-bipyridyl-4,4'-dicarboxylic acid and L' is 2,2'-bipyridyl. Its concentration in absolute ethanol is $5 \times 10^{-4}$M. Prolonged exposure of the film to the open air prior to dye adsorption is avoided in order to prevent hydroxylation of the $TiO_2$ surface as the presence of hydroxyl groups at the electrode surface interferes with dye uptake. The adsorption of chromophore from the ethanolic solution is allowed to continue for 30 minutes, after which time the glass sheet is withdrawn and washed briefly with absolute ethanol. The $TiO_2$ layer on the sheet assumed a deep red color owing to the chromophore coating.

The photocurrent action spectrum was obtained with such a film using a conventional three electrode electrochemical cell containing an ethanolic solution of 0.5M LiI and $3 \times 10^{-3}$M iodine. The incident monochromatic photon to current conversion efficiency (IPCE) was plotted as a function of the excitation wavelength. This was derived from the equation:

$$IPCE(\%) = \frac{[(1.24 \times 10^3) \times \text{photocurrent density } (\mu A/cm^2)]}{[\text{wavelength (nm)} \times \text{photon flux } (W/m^2)]} \quad (1)$$

From the overlap of the photocurrent action spectrum with solar emission the overall efficiency for the conversion of solar light to electricity $\eta$ was calculated from the formula $$\eta = 12 \times OCV \times FF(\%) \quad (2)$$

where OCV is the open circuit voltage and FF is the fill factor of the photovoltaic cell.

For experimental verification of equation 2, a photovoltaic cell, shown in FIG. 1, is constructed, using a dye (4)-loaded $TiO_2$ (5) film supported on a conducting glass (the working electrode) comprising a transparent conductive tin dioxide layer (6) and a glass substrate (7) as a photoanode. The cell has a sandwich-like configuration, the working electrode (4–7) being separated from the counter electrode (1,2) by a thin layer of electrolyte (3) having a thickness of ca. 20 microns. The electrolyte used is an ethanolic solution of 0.5M LiI and $3 \times 10^{-3}$M iodine. The electrolyte (3) is contained in a small cylindrical reservoir (not shown) attached to the side of the cell from where capillary forces attract it to the interelectrode space. The counter-electrode comprises the conductive tin dioxide layer (2) deposited on a glass substrate (1) made also of Asahi conducting glass and is placed directly on top of the working electrode. A monomolecular transparent layer of platinum is deposited onto the conducting glass of the counter electrode (1,2) by electroplating from an aqueous hexachloroplatinate solution. The role of the platinum is to enhance the electrochemical reduction of iodine at the counter electrode. The transparent nature of the counterelectrode is an advantage for photovoltaic applications since it allows the harvesting of light from both the forward and the backward direction. Experiments are carried out with a high pressure Xenon lamp equipped with appropriate filters to simulate AM1 solar radiation.

The intensity of the light is varied between 50 and 600 Watts per square meter and the open circuit voltage is 660 and 800 mV, respectively at these two voltages. The fill factor, defined as the maximum electric power output of the cell divided by the product of open circuit voltage and short circuit current, is between 0.7 and 0.75V. A single crystal silicon cell gave an open voltage of 550 mV at 600W/M² incident light intensity which dropped to below 300 mV at 50 W/M². This clearly shows that the cell of the present invention has a higher open circuit voltage than the silicon solar cell and that the open circuit voltage is less dependent on light intensity than that of the silicon cell. This constitutes a significant advantage for the use of such a cell in indirect sunlight or cloudy weather conditions. The fill factor of the silicon cell is comparable to that of the example. The overall solar light to electricity conversion efficiency of the cell of the example is between 5 and 6%, in agreement with predictions of equation 2.

EXAMPLE 35

A transparent $TiO_2$ film from colloidal titanium dioxide particles which are deposited on a conducting glass support and sintered to yield a coherent highly porous semiconducting film that is transparent can be used instead of the $TiO_2$ layer film in Example 34.

Colloidal titanium oxide particles of approximately 10 nm are prepared by hydrolysis of titanium isopropoxide as follows:

125 ml of titanium isopropoxide is added to a solution of 0.1M nitric acid in 750 ml of water whilst stirring. A precipitate of amorphous titanium dioxide is formed under these conditions. This is heated to 80° C. for approximately 8 hours, stirring vigorously, resulting in peptisation of the precipitate and formation of a clear solution of colloidal anatase. The anatase structure of the titanium dioxide particles is established by Raman spectroscopy. The sol is concentrated by evaporation of the solvent in vacuum at room temperature until a viscous liquid is obtained containing the colloidal particles. At this stage the nonionic surfactant TRITON X-100 (40% weight of $TiO_2$) is added to reduce cracking of the film when applied to a substrate.

The titanium dioxide films are formed by spin coating the concentrated sol onto a conducting glass substrate. Usually, it is sufficient to apply 6 to 10 layers in order to obtain semiconductor membranes of sufficient surface area to give excellent visible light harvesting efficiencies after deposition of a monolayer of the sensitizer.

Low resolution electron microscopy confirms the presence of the three layer structure, the lowest being the glass support, followed by the 0.5 micron thick fluorine-doped $SnO_2$ and the 2.7 micron thick titanium dioxide layer. High resolution electron microscopy reveals the $TiO_2$ film to be composed of a three dimensional network of interconnected particles having an average size of approximately 16 nm. Apparently, significant particle growth occurs during sintering.

The transparent $TiO_2$ films are tested in conjunction with a sensitizer, Ru $L_3$ where L is 2,2'bipyridyl-4,4'dicarboxylic acid regenerative cell for the generation of electricity from visible light. The results can be represented where the photocurrent under simulated sunlight (intensity ca 30W/m²) is plotted as a function of cell voltage. The open circuit voltage under these conditions is 0.52V and the short circuit current 0.381 mA/cm². The fill factor is 0.75, yielding an efficiency of 5%. Under the same conditions, a commercial silicon photovoltaic cell gave a short circuit current of 1 mA and open circuit voltage of 0.4V and a conversion efficiency of 10%, which is only a factor of two higher than that obtained with the titanium dioxide membrane.

EXAMPLE 36

A sheet of conducting glass (ASAHI) of area 1 resistance ca 10 Ohm/square) having a size of $2\times9.6$ cm$^2$ is coated with a colloidal titanium dioxide film according to the procedure of Example 35. A total of 7 layers of TiO$_2$ colloid are deposited successively by spin coating and the film is subjected each time to calcination at 500° C. for 30 minutes. 30% (w/w) of TRITON X 405 surfactant is added in order to avoid cracking of the film.

The final thickness of the titanium dioxide film is 5 microns as determined from the optical interference pattern. It is important to note that the conducting glass sheet after deposition of the TiO$_2$ remains clear and transparent to visible and near infrared light. The transmission spectrum recorded on a conventional spectrophotometer shows that a fraction of more that 60% of the visible light in the wavelength region between 400 and 900 nm is transmitted through the film. A UV/visible absorption spectrum of the electrode can be obtained. It exhibits a flat feature in the visible due to light absorption and scattering by the conducting glass and the 5 nm thick TiO$_2$ film. The steeply rising part of the absorption below 400 nm is due to the band gap absorption of the TiO$_2$.

Immediately before coating with dyestuff, the film is fired for 1 hour at 500° C. The coating of TiO$_2$ with dyestuff is performed by immersing the glass sheet for 16 hours in an ethanolic solution containing the trimeric ruthenium complex RuL$_2$ (CNRuL'$_2$CN)$_2$ where L stands for 2,2-bipyridyl 4,4'-dicarboxylate and L' stands for 2,2'-bipyridyl. After coating, the glass sheet displays an intensive dark red coloration. The optical absorption spectrum measured with a conventional UV/visible spectrophotometer shows the absorbance in the vicinity of 500 nm to exceed the value of 2, indicating that in this wavelength range more than 99% of the photons are absorbed by the dyestuff deposited onto the titanium dioxide film. It is important to note that, due to the high concentration of dyestuff, the porous film is capable of harvesting photons over a very broad spectral range extending from 400 to 750 nm.

After dye deposition, the glass sheet is cut into two parts each having a size of ca. 9 cm$^2$. These sheets serve as working electrodes (photo-anodes) in the module whose assembly is described further below.

Transparent counterelectrodes are made of the same type of ASAHI conducting glass as the working electrodes. The counterelectrode was not coated with TiO$_2$. Instead, the equivalent of 10 monolayers of Pt is electrochemically deposited onto conducting glass. The transparent nature of the counterelectrode is not affected by the deposition of the Pt, its transmission in the visible and near infrared remaining greater that 60%. The Pt acts as an electrocatalyst, enhancing the rate of reduction of the electron transfer mediator, i.e. triiodide, at the counterelectrode. Two ca. 1 mm deep and 1.5 mm wide and 20 mm long indentations are engraved into the surface of the counterelectrode close to the edges of the glass sheets. These serve as a reservoir for the electrolyte.

The counter electrode is placed directly on top of the working electrode to yield a sandwich-type configuration. After filling the reservoirs with electrolyte, the cell was sealed with epoxy resin. The wetting of the space between the two electrodes by the electrolyte occurs spontaneously by capillary action. The electrolyte is a solution of 0.5M tetrapropyl ammonium iodide and 0.02M iodine in ethanol.

Two cells are fabricated in this way, each having a surface area of ca. 9 cm$^2$. Subsequently, they are connected in series by electrically contacting the photoanode of one cell to the cathode of the second cell. In this way a module is constructed, having a total surface area of 18 cm$^2$.

The performance characteristics of this module can be shown, referring to monochromatic light of 520 nm wavelength and an intensity of 0.38W/m2. The short circuit photocurrent of 0.115 mA corresponds to an incident monochromatic photon to current conversion efficiency of 74%. The fill factor is 0.74 and monochromatic power conversion efficiency is 12% at 520 nm.

Results can also be produced under natural light conditions. The overall incident light intensity was ca. 3W/m2. Under these conditions, the short circuit photocurrent of the module was 0.76 mA, the fill factor of the cell was 0.73, and the overall conversion efficiency of day light into electrical power was 11%. By comparison, a 1 cm$^3$ sized commercial silicon cell under the same conditions gave a short circuit photocurrent of 0.17 mA, an open circuit voltage of 0.21V, a fill factor of 0.5, and an overall conversion efficiency of 6%. The comparison of these results shows clearly that the performance of the TiO$_2$ cell under diffuse daylight is superior to that of a conventional silicon device. A final test was performed under direct sunlight in the early morning of the following day. The current output was 60 mA at a solar intensity of ca. 600 W/m$^2$ and the open circuit potential was 1.5V. The fill factor of the cell was reduced to 0.6 due to ohmic losses in the conducting glass, yielding an overall efficiency of 5.6%.

EXAMPLE 37

A preferred photovoltaic cell is shown with reference to FIG. 1.

A photovoltaic device based on the sensitization of a transparent TiO$_2$ film is made from colloidal titanium dioxide particles which are deposited on a conducting glass support and sintered to yield a coherent highly porous semiconducting film.

Colloidal titanium oxide particles of approximately 8 nm are prepared by hydrolysis of titanium isopropoxide as follows:

125 ml titanium isopropoxide is added to a solution of 0.1M nitric acid in 750 ml water while stirring. A precipitate of amorphous titanium dioxide is formed under these conditions. This is heated to 80° C. for approximately 8 hours, stirring vigorously, resulting in peptisation of the precipitate and formation of a clear solution of colloidal anatase. The propanol formed by the hydrolysis is allowed to evaporate during the heating. The colloidal solution is then autoclaved at 140° to 250° C., preferably 200° C., in a pressure vessel of titanium metal or Teflon for 2 to 20 hours, preferably 16 hours. The resultant sol, containing some precipitate is stirred or shaken to resuspend the precipitate. The resulting sol, minus any precipitate that will not resuspend, is concentrated by evaporation of the solvent in vacuum at room temperature until a viscous liquid is obtained containing the colloidal particles. A typical concentration at this point is 200 g/L. At this stage a polyethylene oxide polymer, for example Union Carbide Carbowax 20M or Triton X-405, can be added to increase the thickness of the layer that be deposited without cracks. The polymer is added in amount of 30 to 50, preferably 40, weight percent $TiO_2$.

The electrodes for sensitization are formed from the colloidal solution as follows:

A suitable substrate, for example a 3×6 cm piece of conductive tin oxide coated glass, for example from Asahi Corp. (but also titanium metal or any flat conductive surface), is placed with the conductive surface up and with suitable spacers, for example 50 to 100 microns, preferably 80 microns thick plastic tape, placed along each edge. A suitable amount of the sol, for example 150 microliters of sol with 200 g/L $TiO_2$ and 40% Carbowax 20M for the above substrate, is piperted along one end of the substrate. The sol is spread across the substrate by drawing with a flat edged piece of glass whose ends ride along the spacers. Thus the spacers, the viscosity of the sol, and the concentration of the sol control the amount of $TiO_2$ deposited. The as-spread film is allowed to dry in room air till visibly dry and preferably for an additional 20 minutes. After drying, the electrode is fired at 400° to 500° C., preferably 450° C., for a minimum of 20 minutes. In the case of sols autoclawed below 170° C. the spacers of less than 40 microns must be used and the process must be repeated twice to achieve an 8 to 10 microns thick $TiO_2$ film.

Electrodes of up to 10 cm by 10 cm have been fabricated by this method. The sol can also be applied to substrates by spin coating and dip coating.

The electrode can then be cut to the size desired by normal glass cutting techniques. Immediately before applying the sensitizer the electrode is fired again at 450° to 550°, preferably 500° C. for 2 to 12, preferably 6 hours. For some solvent and dye combinations, the surface of the electrode is improved (with respect to electron injection) by firing the electrode 5 to 10, preferably 7 times at 500° C. for 2 to 6 hours with either 10 hours in air or soaking up to 1 hour in water, 0.5M nitric acid or 0.5M HCl, between each firing. The acid solutions are saturated with dissolved $TiO_2$ before use. After the last firing, immediately after cooling, the electrode is placed in the sensitizer solution. Preferably, an ethanolic solution containing the trimeric ruthenium complex $RuL_2(CNRuL'_2CN)_2$ where L stands for 2,2-bipyridyl 4,4'-dicarboxylate and L' stands for 2,2'-bipyridyl, but also equally an ethanolic solution of $RuL_2NCS_2$ or $RuL_1L'_1H_2O$ where L' stands for 2,6-bis(N-methylbenzimidazol-2'-yl)pyridine. Depending on the sensitizer, between 4 and 24 hours are required for the electrode to gain full color. Full color can be estimated by eye or by taking visible light transmittance spectra of the dye at various times.

After removal from the dye solution, the electrode is made into a photovoltaic cell as follows:

Transparent counterelectrodes are made of the same type of ASAHI conducting glass as the working electrodes. The counterelectrode is not coated with $TiO_2$. Instead, the equivalent of 10 monolayers of Pt is electrochemically deposited onto conducting glass. The transparent nature of the counterelectrode is not affected by the deposition of the Pt, its transmission in the visible and near infrared remains greater that 60%. The Pt acts as an electrocatalyst enhancing the rate of reduction of the electron transfer mediator, i.e. triiodide, at the counterelectrode. Alternatively, a thin titanium sheet, which may be porous coated as above with Pt, may be used as a counterelectrode. In the case of a porous sheet, another sheet of impervious material is required behind the counterelectrode, such as plastic, glass or metal.

A reservoir is provided for the electrolyte by engraving two ca. 1 mm deep and 1.5 mm wide and 20 mm long clefts into the surface of the counterelectrode close to the edges of the glass sheet; The reservoir can also be added external to the glass sheets or be behind the counterelectrode in the case of porous counterelectrode.

The counterelectrode is placed directly on top of the working electrode to yield a sandwich type configuration. The reservoirs are filled with electrolyte solution, selected from the list above but preferably 85% by weight ethylene carbonate, 15% propylene carbonate 0.5M potassium iodide, and 40 mM iodine. An amount of LiI or tetraalkylamonium iodide can be present (preferably 20 mM), depending on the voltage desired. The cell is sealed around the edge with a sealant compatible with the solvent chosen and bonded closed with an adhesive. The sealant and the adhesive may be the same material, for example silicon adhesive in the case of the alcohol solvents, or for example, polyethylene and epoxy resin (or mechanical closure) in the case of ethylene carbonate. The wetting of the space between the two electrodes by the electrolyte injected into the reservoirs occurs spontaneously by capillary action.

Photovoltaic cells of the type described in the preceding paragraphs have produced up to 12 $mA/cm^2$ short circuit current and up to 830 mV open circuit voltage under simulated sunlight of 80 $mW/cm^2$. The most efficient combination has been 9.6 $mA/cm^2$ and 620 mV with a fill factor or 51%, thus an energy conversion efficiency of 3.8%. Fill factors above 60% have been measured.

The complexes of the other examples of Examples 1 to 33 can be used in place of the ruthenium complexes of Examples 34 to 37 in the photovoltaic cell.

We claim:

1. A solar-light-responsive photovoltaic cell comprising a first electrode comprising
   i) a light transmitting electrically conductive layer deposited on a glass plate or a transparent polymer sheet;
   ii) at least one porous, high surface area titanium dioxide layer applied to said light transmitting electrically conductive layer;
   iii) a dopant applied to at least the outermost titanium dioxide layer, optionally also to the second to the outermost and third to the outermost layer, said dopant being selected from a divalent metal ion, trivalent metal ion, and boron; and
   iv) a photosensitizer applied to the dopant-containing $TiO_2$ layer, said photosensitizer being attached to the $TiO_2$ layer by means of interlocking groups, said interlocking groups being selected from carboxylate groups, cyano groups, phosphate groups and chelating groups with II conducing character selected from oximes, dioximes, hydroxy quinolines, salicylates, and α-keto-enolates.

2. A solar-light-responsive photovoltaic cell according to claim 1, further comprising
   i) a second electrode wherein at least one of the first and second electrodes is transparent and has a visible light transmittance of at least 60%, the electrodes being arranged so as to define a receptacle between them, in which receptacle an electrolyte containing a redox system is located; and ii) means for permitting the output of an electrical current generated by the cell.

3. A photovoltaic cell according to claim in which the interlocking groups are selected from carboxylates and cyano groups.

4. A photovoltaic cell, according to claim 1 in which the photosensitizer is a ruthenium, osmium, or iron complex, or a combination of two or three transition metals.

5. A photovoltaic cell, according to claim 1 in which the photosensitizer is a transition metal complex, the ligands being bidentate, tridentate, or polydentate polypyridyl compounds, which may be unsubstituted or substituted.

6. A photovoltaic cell, according to claim 4 in which the photosensitizer is selected from ruthenium and osmium complexes.

7. A photovoltaic cell according to claim 1 in which the photosensitizer is selected from a compound of the formula (1) to (10)

(1)

(2)

(3)

(4)

(5)

(6)

(7)

(8)

(9)

(10)

in which each M is independently selected from ruthenium, osmium, and iron; $\mu$-(CN) or $\mu$-(NC) indicates that the cyano group bridges two metal atoms;

each $L^a$, $L^b$, $L^c$ and $L^d$ independently is selected from 2,2'-bipyridyl, unsubstituted or substituted by one or two COOH groups; 2,2' bipyridyl substituted by one or two groups selected from $C_{1-16}$alkyl, $C_{1-16}$alkoxy and diphenyl; 2,2'-biquinoline unsubstituted or substituted by one or two carboxy; groups; phenanthroline, unsubstituted or substituted by one or two carboxy groups and/or one or two hydroxy groups, and/or one or two dioxime groups; bathophenanthroline disulfonic acid; diaza-hydroxy-carboxyl-triphenylene; carboxy pyridine; phenyl pyridine; 2,2'-Bis(diphenylphosphino) 1,1'-binaphthalene; (pyridyl azo) resorcinol; bis (2-pyridyl) $C_{1-4}$alkane; tetra $C_{1-4}$alkyl ethylene diamine; and di-$C_{1-4}$alkyl glyoxime;

$L^g$ is selected from terpyridyl, unsubstituted or substituted by phenyl, which phenyl group is unsubstituted or substituted by COOH and a dicarboxypyridine;

each X independently is halo, $H_2O$, CN, a primary or secondary alkylamine, and/or pyridine.

8. A photovoltaic cell comprising i) an electrically conductive first plate on which a $TiO_2$ film having a thickness of 0.1–50 microns is coated, said $TiO_2$ film being a multi-layer laminate coated with a transition metal complex photosensitizer, at least the last layer of the $TiO_2$ film being doped with a dopant selected from divalent metal ions, trivalent metal ions, and boron; and ii) A conductive second plate separated from the first plate by a thin layer of electrolyte, wherein the visible light transmittance of at least one of the plates is at least 60%.

* * * * *

UNITED STATES PATENT AND TRADEMARK OFFICE
CERTIFICATE OF CORRECTION

PATENT NO. : 5,350,644　　　　　　　　　　　　　　Page 1 of 2
DATED　　　 : September 27, 1994
INVENTOR(S) : Michael Graetzel et al.

It is certified that error appears in the above-indentified patent and that said Letters Patent is hereby corrected as shown below:

In the Abstract, line 5, the word "leash" should be changed to --least--.

In column 1, line 6, the word "such" should be changed to --the--.

In column 1, line 7, the word "devices" should be changed to --device--.

In column 1, line 33, the word "be" should be changed to --is--.

In column 7, line 38, the formula "$M(1^g)(X)_x Cl$" should be changed to --$M(L^g)(X)_2 Cl$ (10c)--

In column 9, Table 1, items 2, 3, 4 and 5, the second "[" should be changed to --(--.

UNITED STATES PATENT AND TRADEMARK OFFICE
CERTIFICATE OF CORRECTION

PATENT NO. : 5,350,644

DATED : September 27, 1994

INVENTOR(S) : Michael Graetzel et al.

It is certified that error appears in the above-indentified patent and that said Letters Patent is hereby corrected as shown below:

In column 9, Table 1, item 3, column L', the formula "$4,4'-(ME)_2-bpy_2$" should be changed to --$4,4'-(ME)_2-bpy$--.

In column 16, line 58, the word "conducing" should be changed to --conducting--.

Signed and Sealed this

Eleventh Day of April, 1995

*Attest:*

BRUCE LEHMAN

*Attesting Officer*   *Commissioner of Patents and Trademarks*